United States Patent
Liu et al.

(10) Patent No.: US 6,583,045 B1
(45) Date of Patent: Jun. 24, 2003

(54) CHIP DESIGN WITH POWER RAILS UNDER TRANSISTORS

(75) Inventors: Louis Liu, Hsin-Chu (TW); Hsiao-Hsuan Chou, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/991,309

(22) Filed: Nov. 16, 2001

(51) Int. Cl.[7] .......................................... H01L 21/4763
(52) U.S. Cl. ...................................... 438/620; 257/276
(58) Field of Search ................................. 438/620, 622, 438/214; 257/276, 508

(56) References Cited

U.S. PATENT DOCUMENTS

| | | | |
|---|---|---|---|
| 4,811,237 A | 3/1989 | Putatunda et al. | 364/491 |
| 5,404,310 A | 4/1995 | Mitsuhashi | 364/490 |
| 5,936,282 A | 8/1999 | Baba et al. | 257/355 |
| 6,060,748 A | 5/2000 | Uchida et al. | 257/347 |
| 6,355,950 B1 * | 3/2002 | Livengood et al. | 257/276 |

* cited by examiner

Primary Examiner—Hoai Ho
Assistant Examiner—Quoc Hoang
(74) Attorney, Agent, or Firm—George O. Saile; Stephen B. Ackerman; William J. Stoffel

(57) ABSTRACT

A method and an integrated circuit having power rails under transistors. In a preferred embodiment, power rails are formed over a substrate. Devices, such as FET transistors, are formed over the power rails. A preferred device is an inverter. The method comprises forming a first power rail (VSS) over the substrate. Then forming a second power rail (e.g., VDD) over the first power rail. The second power rail is insulated from the first power rail. Next, transistors are formed over the first and the second power rails.

24 Claims, 5 Drawing Sheets

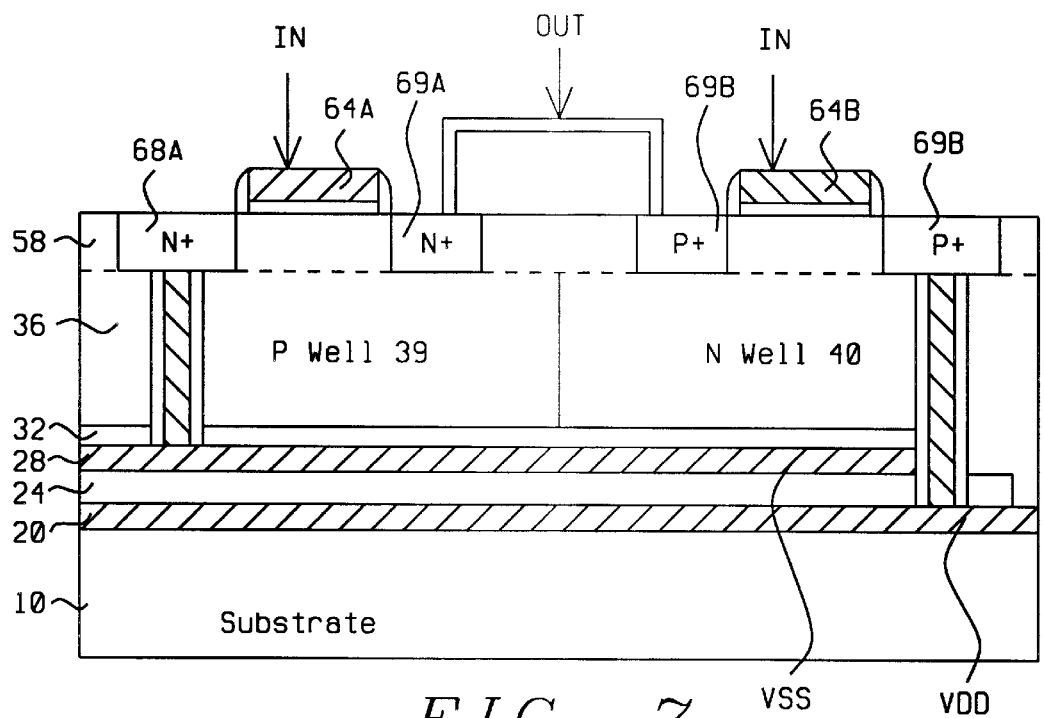
FIG. 7
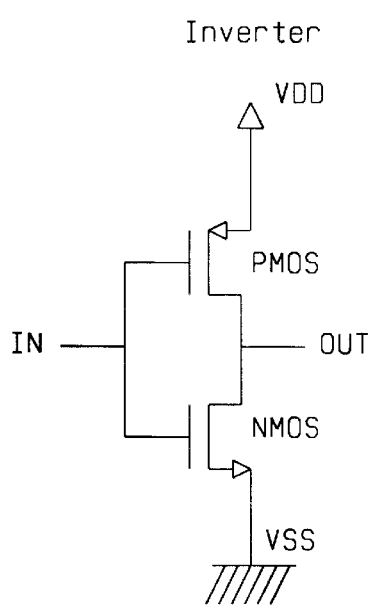
FIG. 8 – Prior Art

CHIP DESIGN WITH POWER RAILS UNDER TRANSISTORS

BACKGROUND OF INVENTION

1) Field of the Invention

This invention relates generally to the structure and fabrication of semiconductor devices and more particularly to the placement of power rails (VSS/VDD) under transistors.

2) Description of the Prior Art

For IC designs using standard cells, Place & Route is a very important step in the design flow to determine the actual layout of the final design. The methodology supported by today's EDA tools is as following.

The standard cells are placed abutted in rows where the power rails (VDD, VSS) feeding the cells goes horizontally on the upper and lower side of the cells.

To keep the IR drop under some certain levels and to conform to the EM (Electro Migration) rules, a power mesh must be routed above the standard cells which provides the standard cell VDD/VSS power rails with power at equally distributed distance. The distance between each feed-point as well as the number of VIAs that must be dropped is dependent of the consumed power and the line width of the power rail. There are also alternatives concerning in which metal layers to route the power mesh. Usually two different layers are used, one for the horizontal routing and one for the vertical routing of the power mesh.

The disadvantages of the current method of placing VDD/VSS power rails in the metal layers over the transistors on the front side of the chip. If lower metal layers are chosen, such as M1 and M2, then empty space between the standard cells where the mesh will be routed, must be reserved on the cost of bigger chip area. This solution is rarely used today. On the other hand, if higher metal layers are chosen, then the stacked VIA's that must be dropped on every feed-point will occupy valuable routing resource on the underlying routing layers. The underlying layers where signals are to be routed will be restricted by the big number of stacked VIA's dropped from the power mesh located at above layers. In summary, the VDD/VSS nets are the only net that must be connected to ALL standard cells and therefore stealing a lot of routing resources from the signal nets.

Another concern is that power routing and signal routing have conflicting requirements on the process characteristics. Signals are switching nets, which requires low Capacitance to achieve low signal delay. Power lines on the contrary are constant and require low Resistance to achieve low IR-drop. From process point of view, low R usually means thicker (deeper) metal layers on the cost of higher C parasitic, while low C means thinner metal layers with higher R as a result. In many processes today the requirements set by Signal routing is dominating (low C, high R). Therefore, the problem of IR-drop and EM on the power lines still remains an increasing problem.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 4,811,237 (Putatunda et al.) Structured Design Method for Generating a Mesh Power Bus Structure in High Density Layout of VLSI Chips; U.S. Pat. No. 5,404,310 (Mitsuhashi) Method and Apparatus for Power-Source Wiring Design of Semiconductor Integrated Circuits; U.S. Pat. No. 6,060,748 (Uchida et al.) Semiconductor Integrated Circuit Device Using a Silicon-Oninsulator Substrate and U.S. Pat. No. 5,936,282 (Baba.et al.) Semiconductor Device having Input Protection Circuit.

SUMMARY OF THE INVENTION

It is an object of the present invention to provide a method for fabricating power rails on the backside of a chip.

It is an object of the present invention to provide an inverter with power rails under the transistors.

The present invention provides a device and a method of manufacturing an integrated circuit with power rails under transistors.

In a preferred embodiment, power rails are formed over a substrate. Then devices, such as transistors, are formed over the power rails. Signal lines can be formed over the devices. A preferred device is an inverter. A preferred embodiment comprises forming a first power rail (e.g., VSS) over a substrate. Then we form a second power rail (e.g., VDD) over the first power rail. The second power rail is insulated from the first power rail. Next,.transistors or other devices are formed over the first and the second power rails.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention.will be more clearly understood from the following description taken in conjunction with the accompanying drawings in which like reference numerals designate similar or corresponding elements, regions and portions and in which:

FIG. 7 is a cross sectional view for illustrating a preferred device and method of the invention's power rail system for an inverter where the power rails are placed under the transistors.

FIG. 8 shows an electrical schematic of an inverter circuit according to the prior art.

DETAILED DESCRIPTION OF THE PREFERRED EMBODIMENTS

The present invention will be described in detail with reference to the accompanying drawings. The present invention provides a method of forming power rails under transistors.

Preferred Embodiment of a Method of The Invention

A preferred embodiment of a method of the invention for an integrated circuit with power rails under transistors comprises the following. Note that the dimensions described herein are for a technology and are an example. The dimensions and compositions are not limiting to the invention.

Figure 1:
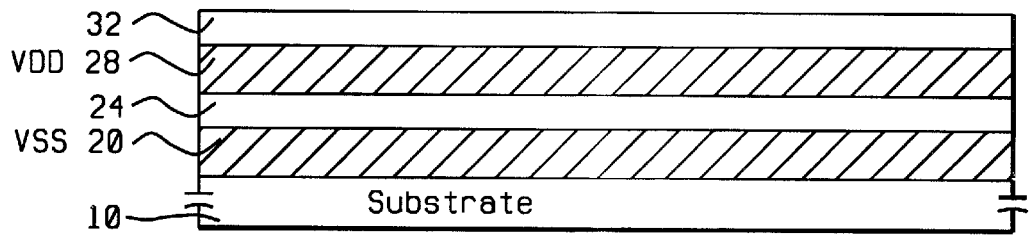
FIGS. 1, 2, 3, 4, and 5 are a cross sectional views for illustrating a preferred method of the invention's power rail system where the power rails are placed under the transistors.

As shown in FIG. 1, a substrate 10 is provided. The substrate is preferably a silicon semiconductor substrate.

Next, we form a first power rail. (e.g., VSS) 20 over the substrate 10. The first power rail is preferably comprised a conductive material such as a metal and preferably comprised of tungsten (W).

Then a first insulating layer 24 is formed over the first power rail 20. The first insulating layer can be comprised of an oxide.

Next, we form a second power rail (e.g., VDD) 28 over the first insulating layer 24. The second power rail can be comprised of the same materials as the first power rail. The first and second power rails preferably have a thickness between 0.3 and 1 μm.

A second insulating layer 32 is formed over the second power rail 28. The second insulating layer can be formed of the same materials as the first insulating layer.

Figure 2:
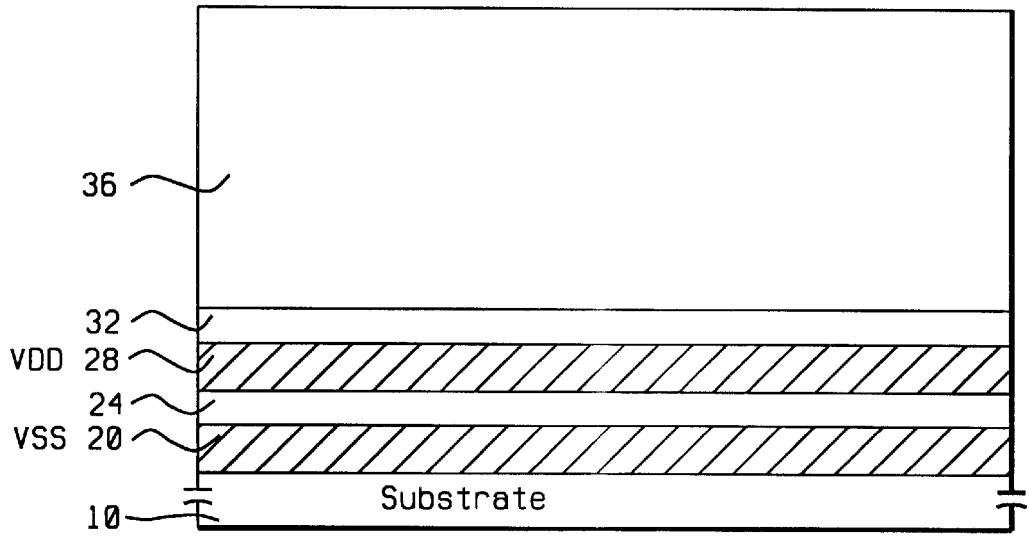

Referring to FIG. 2, we form a first epi layer 36 over the second insulating layer 32. The first epi layer is preferably comprised of silicon and preferably has a thickness of between 4 and 20 μm.

Next optional N and/or P wells can be formed. The n and p wells can be formed in different areas of the chip or wafer. (For example see wells 39 and 40 in FIG. 7).

Figure 3:
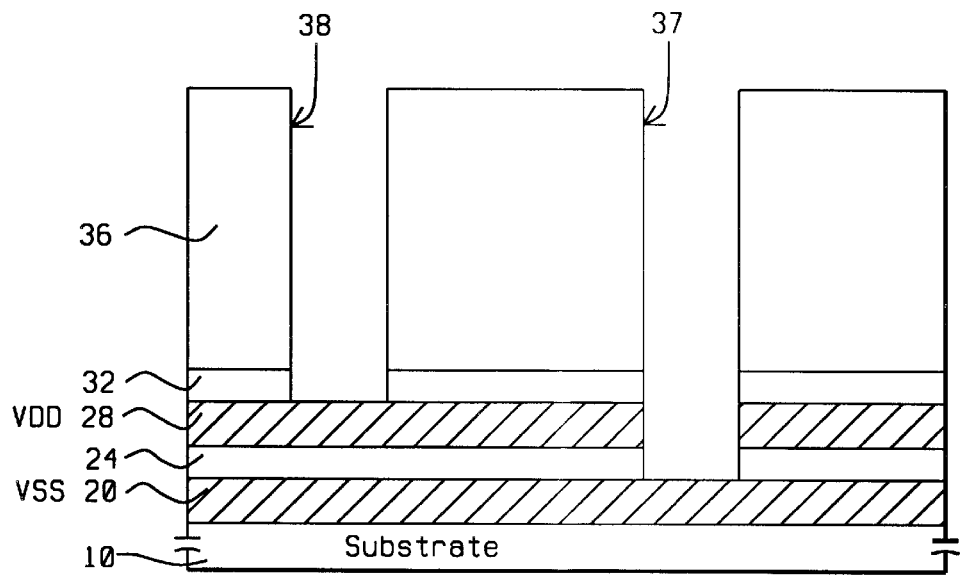

Referring to FIG. 3, we form first and second contact holes 37 38 in the first epi layer 36. The first contact hole 37 exposes the first power rail 20. The second contact hole 38 exposes the second power rail 28. The contact holes preferably have a diameter or width between 0.3 and 1.0 μm and a depth between 4 and 20 μm. Preferably the first and second contact holes 37 38 are formed using an electrochemical etch.

Figure 4:
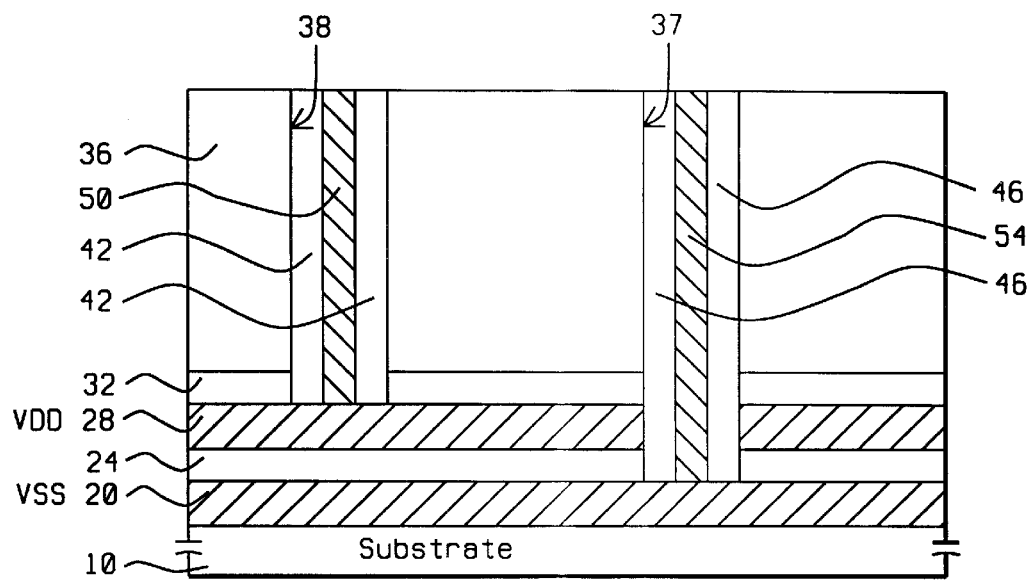

Referring to FIG. 4, we form first and second liner layers 42 46 on the sidewalls of the first and second contact holes 37 38.

Referring to FIG. 4, we form a first contact plug 54 in the first contact hole 37 to contact the first power rail 20, and form a second contact plug 50 in the second contact hole 38 to contact the second power rail 28. The contact plugs are preferably formed of a metal such as W.

Figure 5:
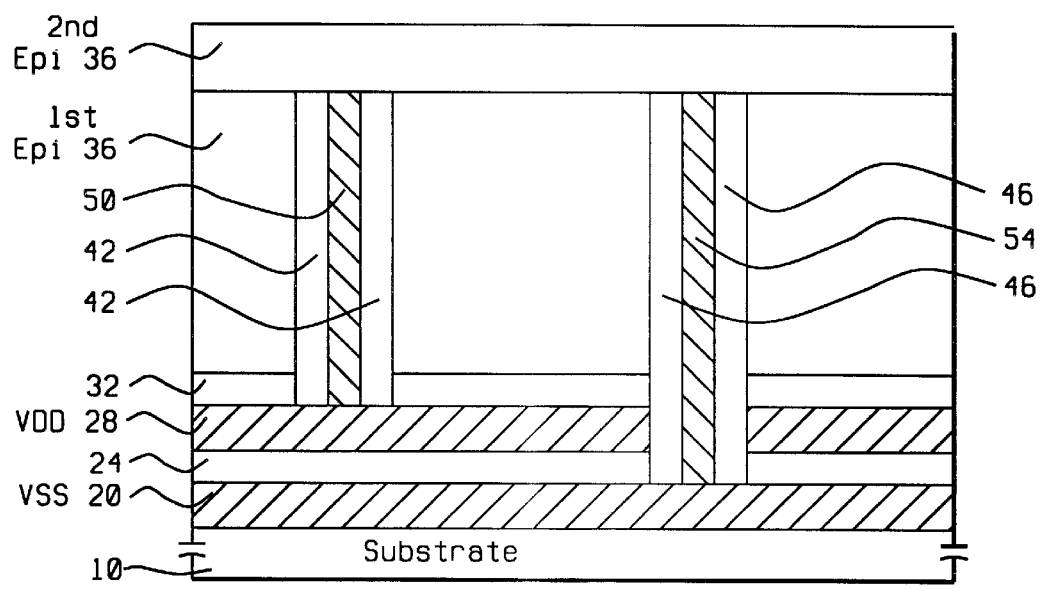

As shown in FIG. 5, we form a second epi layer 58 over the first epi layer 36 and the first and second liner layers 42 46 and the first and second contact plugs 54 50.

Figure 6:
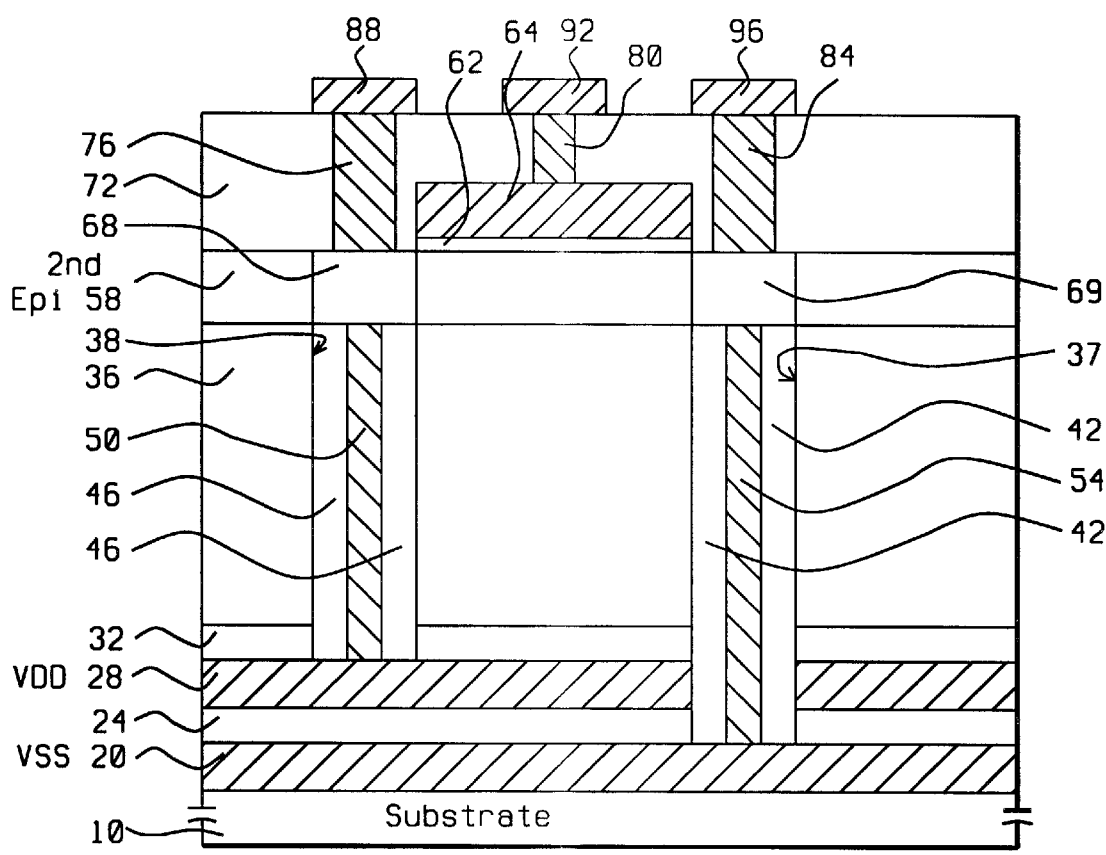
FIG. 6 is a cross sectional view for illustrating a preferred embodiment of a method and a structure of the invention's power rail system where the power rails are placed under the transistors.

Referring to FIG. 6, we form a gate dielectric layer 62 over the second epi layer 58.

A gate 64 is formed over the gate dielectric layer.

Next we form source and drain regions 68 69 in the second epi layer 58 adjacent to the gate 64. The source and drain regions 68 69 contact the first and second contact plugs 50 54. The source and drain regions can be formed by an implant process. Note that both N and P MOS devices can be formed on different parts to the wafer by using both N and P type implants.

We form a dielectric layer 72 over the second epi layer 58, the source and drain regions 68, and the gate 64.

Next, contacts 76 80 84 are formed to the source and drain regions 68 69 and the gate 65.

As shown in FIG. 6, we form a patterned first conductive layer 88 92 96 to contact the contacts 76 80 84. The conductive layer is for illustration. Different configurations can be used to connect the transistors. A preferred connection an invert.

Preferred Embodiment of a Structure

A preferred embodiment of a device of the invention with power rails under transistors comprises the following. As shown in FIG. 6, a first power rail (VSS) 20 is over a substrate 10. A first insulating layer 24 is over the first power rail 20. A second power rail (e.g., VDD) 28 is over the first insulating layer 24. A second insulating layer 32 is over the second power rail 28. Transistors are over the second insulating layer. Contacts (e.g., 50 54) are to the first and second power rails.

In a preferred embodiment the transistors comprise the following. As shown in FIG. 6, a first epi layer 36 is over the second insulating layer 32. First and second contact holes 37 38 are in the first epi layer 36. The first contact hole 37 exposes the first power rail 20, and the second contact hole 38 exposes the second power rail 28. First and second liner layers 42 46 are on the sidewalls of the first and second contact holes 37 38. A first contact plug 54 is in the first contact hole 37 to contact the first power rail 20. A second contact plug 50 is in the second contact hole 38 to contact the second power rail 28. A second epi layer 58 is over the first epi layer 38 and the first and second liner layers 42 46 and the first and second contact plugs 54 50. A gate dielectric layer 62, and a gate 64 are over the second epi layer 58. Source and drain regions 68 69 are in the second epi layer 58 adjacent to the gate 64. The source and drain regions 68 69 contact the first and second contact plugs 50 54. A dielectric layer 72 is over the second epi layer 58, the source and drain regions 68, and the gate 64. Contacts 76 80 84 are to the source and drain regions 68 69 and the gate 65.

A first conductive layer 88 92 96 is connected to the contacts 76 80 84.

Signal lines can be formed over the transistors.

Inverter Layout of the Invention

FIG. 8 shows an electric schematic of an inverter circuit.

FIG. 7 shows an inverter as a preferred embodiment of the invention. The process and elements to form the inverter is similar as described above. The power rails (e.g., 20 (VDD), 28 (VSS)) are preferably formed under the epi layers and the transistors are formed over the power rails. The P and N wells are preferably formed after the first epi layer 56 is formed. Later, the source and drain regions 68A 69A 68B 69B are formed with both N and p doping to subsequently form N and P MOS transistors and possibly other devices. For example in FIG. 7, the source and drains 68A 69B are n doped and the source and drains 68B 69B are p doped. The doping could be reversed.

An inverted can be formed by having current in lines to the gates 64A 64B and out lines contacting the S/D regions 69A 68B as shown in FIG. 7. Other options Many other options are possible. For example, SOI devices can be formed over the power rails. Also, different types of devices can be formed on different areas of the chip, such as bipolar devices, active and passive devices, low and high voltage devices. Also, the power rails could be formed only under certain areas of the chip or under certain types of devices.

Benefits of the Invention

The main problem is with the prior art's power rails over transistors is that power routing resources are shared with signal routing resource. With the invention, by adding two conductive (e.g., metal) layers 20 28 (+dielectric) under the transistor and epi, we can move the power routing resources to the under side of the transistor and signal routing layers and thus utilizing the obvious geometric advantage of connecting nets from both sides of the devices. Thus, we have created a subway for the VDD/VSS nets.

The VDD/VSS nets could be a big metal plan or actual routed channels depending on the need for multiple power. The task of power routing will then simply be to add underground VIAs to those diffusion areas where power is needed.

This invention's solution also implies that the standard cell internal layout can be differently constructed compared with today. The need of power rail on the cell top and bottom can be skipped as well as the cell internal power routing. This removes many constraints on the cell layout and gives freedom for minimizing the cell layout The invention provides the following benefits:

Eliminate the problem of power routing

Eliminate the problems of IR-drop and EM on power nets.

Full routing resources for signals

Process can be tuned to optimize for power as well as signal routing without conflicting with each other Chip area improvement (>50%) because area is not consumed by the power rails on the front side.

Chip performance improvement (>25%)

Design turnaround time improvement (>50%)

Improve designs by routing global power nets without occupying signal routing resources Decreasing routing RC-parasitics Decreasing design turnaround time In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention Unless explicitly stated otherwise, each numerical value and range should be interpreted as being approximate as if the word about or approximately preceded the value of the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for an integrated circuit with power rails under transistors; comprising:

a) providing a substrate; then b) forming a first power rail over said substrate; then c) forming a second power rail over said first power rail; said second power rail is insulated from said first power rail; then forming an epi layer over said first power rail and second power rail; then d) forming transistors over and/or in said epi layer, said transistor are over said first and said second power rails; said substrate is under said first power rail and said second power rail; and said first power rail and said second power rail are under said epi layer.

2. A method for an integrated circuit with power rails under transistors; comprising:

a) providing a substrate;

b) forming a first power rail over said substrate;

c) forming a first insulating layer over said first power rail;

d) forming a second power rail over said first insulating layer;

e) forming a second insulating layer over said second power rail; and f) forming a first epi layer over said second insulating layer;

g) forming first and second contact holes in said first epi layer; said first contact hole exposing said first power rail; and said second contact hole exposing said second power rail, h) forming first and second liner layers on the sidewalls of said first and second contact holes;

i) forming a first contact plug in said first contact hole to contact said first power rail; and forming a second contact plug in said second contact hole to contact said second power rail;

j) forming a second epi layer over said first epi layer and said first and second liner layers and said first and second contact plugs;

k) forming a gate dielectric layer, a gate over said second epi layer;

l) forming source and drain regions in said second epi layer adjacent to said gate; said source and drain regions contact said first and second contact plugs.

3. The method of claim 2 wherein said first power rail comprised of W.

4. The method of claim 2 wherein said first power rail has a thickness between 0.3 and 1 $\mu$m.

5. The method of claim 2 wherein said second power rail comprised of W.

6. The method of claim 2 wherein said second power rail has a thickness between 0.3 and 1 $\mu$m.

7. The method of claim 2 which further includes:

a) forming a dielectric layer over said second epi layer, said source and drain regions, and said gate;

b) forming contacts to said source and drain regions and said gate; and c) forming a first conductive layer to contact said contacts.

8. The method of claim 2 wherein said first epi layer has a thickness between 4 and 20 $\mu$m.

9. The method of claim 2 wherein said first and second contact holes are formed using an electrochemical etch.

10. The method of claim 2 wherein said first and second contact holes have a width between 0.3 and 1 $\mu$m and a depth between 0.4 and 20 $\mu$m.

11. The method of claim 2 which further includes forming an inverter.

12. A method for an integrated circuit with power rails under transistors; comprising:
   a) providing a substrate;
   b) forming a first power rail over said substrate;
   c) forming a first insulating layer over said first power rail;
   d) forming a second power rail over said first insulating layer;
   e) forming a second insulating layer over said second power rail;
   f) forming a first epi layer over said second insulating layer and said substrate;
   g) forming first and second contact holes in said first epi layer; said first contact hole exposing said first power rail; and said second contact hole exposing said second power rail;
   h) forming first and second liner layers on the sidewalls of said first and second contact holes;
   i) forming a first contact plug in said first contact hole to contact said first power rail; and forming a second contact plug in said second contact hole to contact said second power rail;
   j) forming a second epi layer over said first epi layer and said first and second liner layers and said first and second contact plugs;
   k) forming a gate dielectric layer, a gate over said second epi layer;
   l) forming source and drain regions in said second epi layer adjacent to said gate; said source and drain regions contact said first and second contact plugs;
   m) forming a dielectric layer over said second epi layer, said source and drain regions, and said gate;
   n) forming contacts to said source and drain regions and said gate;
   o) forming a first conductive layer to contact said contacts.

13. The method of claim 12 wherein said first power rail comprised of W.

14. The method of claim 12 wherein said first power rail has a thickness between 0.3 and 1 $\mu$m.

15. The method of claim 12 wherein said second power rail comprised of W.

16. The method of claim 12 wherein said second power rail has a thickness between 0.3 and 1 $\mu$m.

17. The method of claim 12 wherein said first epi layer has a thickness between 4 and 20 $\mu$m.

18. The method of claim 12 wherein said first and second contact holes are formed using an electrochemical etch.

19. The method of claim 12 wherein forming first and second contact holes have a width between 0.3 and 1 $\mu$m and a depth between 4 and 20 $\mu$m.

20. The method of claim 12 which further includes forming an inverter.

21. A method for an integrated circuit with power rails under transistors; comprising:
   a) providing a substrate;
   b) forming a first power rail over said substrate;
      (1) said first power rail comprised of W;
      (2) said first power rail has a thickness between 0.3 and 1 $\mu$m;
   c) forming a first insulating layer over said first power rail;
   d) forming a second power rail over said first insulating layer;
      (1) said second power rail comprised of W;
      (2) said second power rail has a thickness between 0.3 and 1 $\mu$m;
   e) forming a second insulating layer over said second power rail;
   f) forming a first epi layer over said second insulating layer;
      (1) said first epi layer has a thickness between 4 and 20 $\mu$m;
   g) forming first and second contact holes in said first epi layer; said first contact hole exposing said first power rail; and said second contact hole exposing said second power rail;
      (1) said first and second contact holes are formed using an electrochemical etch;
      (2) forming first and second contact holes have a width between 0.3 and 1 $\mu$m and a depth between 4 and 20 $\mu$m;
   h) forming first and second liner layers on the sidewalls of said first and second contact holes;
   i) forming a first contact plug in said first contact hole to contact said first power rail; and forming a second contact plug in said second contact hole to contact said second power rail;
   j) forming a second epi layer over said first epi layer and said first and second liner layers and said first and second contact plugs;
   k) forming a gate dielectric layer, a gate over said second epi layer;
   l) forming source and drain regions in'said second epi layer adjacent to said gate; said source and drain regions contact said first and second contact plugs;
   m) forming a dielectric layer over said second epi layer, said source and drain regions, and said gate;
   n) forming contacts to said source and drain regions and said gate; and
   o) forming a first conductive layer to contact said contacts.

22. The method of claim 21 which further includes forming an inverter.

23. A method for an integrated circuit with power rails under transistors; comprising:
   a) providing a substrate;
   b) forming a first power rail over said substrate;
   c) forming a second power rail over said first power rail; said second power rail is insulated from said first power rail;
   d) forming an epi layer over said first power rail and second power rail;
   e) forming contact holes in said epi layer to expose said first and said second power rails:
   f) forming-contact plugs in said contact holes; said contact plugs contacting said first and said second power rails;
   g) forming transistors over and/or in said epi layer, said transistors connected to said contact plugs.

24. The method of claim 23 wherein the steps d, e, f, and g, further comprises:
   a) forming a first epi layer over said second power rail;
   b) forming first and second contact holes in said first epi layer; said first contact hole exposing said first power rail; and said second contact hole exposing said second power rail;
   c) forming first and second liner layers on the sidewalls of said first and second contact holes;
   d) forming a first contact plug in said first contact hole to contact said first power rail; and forming a second contact plug in said second contact hole to contact said second power rail;
   e) forming a second epi layer over said first epi layer and said first and second liner layers and said first and second contact plugs;
   f) forming a gate dielectric layer, a gate over said second epi layer;
   g) forming source and drain regions in said second epi layer adjacent to said gate; said source and drain regions contact said first and second contact plugs.

* * * * *